(12) United States Patent
Venkatasubramanian et al.

(10) Patent No.: US 10,745,282 B2
(45) Date of Patent: Aug. 18, 2020

(54) DIAMOND-LIKE CARBON FILM

(71) Applicant: Applied Materials, Inc., Santa Clara, CA (US)

(72) Inventors: Eswaranand Venkatasubramanian, Santa Clara, CA (US); Samuel E. Gottheim, Santa Clara, CA (US); Pramit Manna, Sunnyvale, CA (US); Abhijit Basu Mallick, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/002,222

(22) Filed: Jun. 7, 2018

(65) Prior Publication Data

US 2018/0354804 A1    Dec. 13, 2018

Related U.S. Application Data

(60) Provisional application No. 62/516,828, filed on Jun. 8, 2017, provisional application No. 62/546,266, filed on Aug. 16, 2017.

(51) Int. Cl.
*H01L 21/02* (2006.01)
*C01B 32/28* (2017.01)
*H01L 21/308* (2006.01)
*C01B 32/26* (2017.01)
*H01L 21/311* (2006.01)
(Continued)

(52) U.S. Cl.
CPC ............... *C01B 32/28* (2017.08); *C01B 32/25* (2017.08); *C01B 32/26* (2017.08); *C23C 16/26* (2013.01); *C23C 16/505* (2013.01); *H01L 21/02115* (2013.01); *H01L 21/02205* (2013.01); *H01L 21/02271* (2013.01); *H01L 21/02274* (2013.01); *H01L 21/0332* (2013.01); *H01L 21/3081* (2013.01); *H01L 21/3086* (2013.01); *H01L 21/31111* (2013.01); *H01L 21/31144* (2013.01)

(58) Field of Classification Search
CPC ............ A61B 5/04017; A61B 5/04085; A61B 5/0422; A61B 5/0452; A61B 5/7246; A61B 5/7264; A61B 5/7275; C01B 32/25; C01B 32/26; C01B 32/28; C23C 16/26; C23C 16/505; H01L 21/02115; H01L 21/02205; H01L 21/02271; H01L 21/02274; H01L 21/0332; H01L 21/3081; H01L 21/3086; H01L 21/31111; H01L 21/31144
USPC ........ 216/37, 41, 47, 49, 725; 438/717, 725; 430/5, 296, 311, 312
See application file for complete search history.

(56) References Cited

U.S. PATENT DOCUMENTS 8,105,660 B2    1/2012  Tudhope et al.
8,669,181 B1    3/2014  Yu et al.
(Continued)

OTHER PUBLICATIONS

Non-Final Office Action in U.S. Appl. No. 16/002,218 dated May 28, 2019, 18 pages.

*Primary Examiner* — Lan Vinh
(74) *Attorney, Agent, or Firm* — Servilla Whitney LLC

(57) ABSTRACT

Apparatuses and methods to manufacture integrated circuits are described. A method of forming film on a substrate is described. The film is formed on a substrate by exposing a substrate to a diamond-like carbon precursor having an $sp^3$ content of greater than 40 percent. Methods of etching a substrate are described. Electronic devices comprising a diamond-like carbon film are also described.

13 Claims, 3 Drawing Sheets

(51) Int. Cl.
    *C01B 32/25*     (2017.01)
    *H01L 21/033*    (2006.01)
    *C23C 16/26*     (2006.01)
    *C23C 16/505*    (2006.01)

(56) References Cited

U.S. PATENT DOCUMENTS

| | | | |
|---|---|---|---|
| 2004/0013971 A1* | 1/2004 | Berger | G03F 7/091 |
| | | | 430/270.1 |
| 2005/0100814 A1* | 5/2005 | Berger | G03F 7/0046 |
| | | | 430/270.1 |
| 2008/0226841 A1* | 9/2008 | Ravi | C23C 16/26 |
| | | | 427/585 |
| 2009/0029067 A1* | 1/2009 | Sciamanna | C23C 16/26 |
| | | | 427/577 |
| 2009/0075203 A1* | 3/2009 | Liu | C07C 35/44 |
| | | | 430/285.1 |
| 2009/0176035 A1* | 7/2009 | Tudhope | C23C 16/045 |
| | | | 427/576 |
| 2009/0186206 A1 | 7/2009 | Ito et al. | |
| 2015/0099367 A1 | 4/2015 | Kim et al. | |
| 2018/0240667 A1 | 8/2018 | Yu et al. | |

* cited by examiner

DIAMOND-LIKE CARBON FILM

CROSS-REFERENCE TO RELATED APPLICATIONS

This application claims priority to U.S. Provisional Application No. 62/516,828, filed Jun. 8, 2017, and to U.S. Provisional Application No. 62/546,266, filed Aug. 16, 2017, the entire disclosures of which are hereby incorporated by reference.

TECHNICAL FIELD

Embodiments of the present disclosure pertain to the field of electronic device manufacturing, and in particular, to an integrated circuit (IC) manufacturing. More particularly, embodiments of the disclosure provide methods of depositing diamond-like carbon hard mask films, which can be used for patterning applications.

BACKGROUND

Integrated circuits have evolved into complex devices that can include millions of transistors, capacitors, and resistors on a single chip. The evolution of chip designs continually requires faster circuitry and greater circuit density. The demands for faster circuits with greater circuit densities impose corresponding demands on the materials used to fabricate such integrated circuits. In particular, as the dimensions of integrated circuit components are reduced, it is necessary to use low resistivity conductive materials as well as low dielectric constant insulating materials to obtain suitable electrical performance from such components.

The demands for greater integrated circuit densities also impose demands on the process sequences used in the manufacture of integrated circuit components. For example, in process sequences that use conventional photolithographic techniques, a layer of energy sensitive resist is formed over a stack of material layers disposed on a substrate. The energy sensitive resist layer is exposed to an image of a pattern to form a photoresist mask. Thereafter, the mask pattern is transferred to one or more of the material layers of the stack using an etch process. The chemical etchant used in the etch process is selected to have a greater etch selectivity for the material layers of the stack than for the mask of energy sensitive resist. That is, the chemical etchant etches the one or more layers of the material stack at a rate much faster than the energy sensitive resist. The etch selectivity to the one or more material layers of the stack over the resist prevents the energy sensitive resist from being consumed prior to completion of the pattern transfer.

As the pattern dimensions are reduced, the thickness of the energy sensitive resist must correspondingly be reduced in order to control pattern resolution. Such thin resist layers can be insufficient to mask underlying material layers during the pattern transfer step due to attack by the chemical etchant. An intermediate layer (e.g., silicon oxynitride, silicon carbine, or a carbon film), called a hard mask, is often used between the energy sensitive resist layer and the underlying material layers to facilitate pattern transfer because of greater resistance to the chemical etchant. As critical dimensions (CD) decrease, hard mask materials having the desired etch selectivity relative to underlying materials (e.g., oxides and nitrides) as well as high deposition rates are desired.

SUMMARY

Apparatuses and methods to manufacture integrated circuits are described. In one or more embodiments, a method of forming film on a substrate is described. In one embodiment, a film is formed on a substrate by exposing a substrate to a diamond-like carbon precursor having an $sp^3$ content greater than 40 percent.

In one or more embodiments, a method of etching a substrate is described. In one embodiment, a carbon hard mask is formed on a substrate. The carbon hard mask has at least one opening and is formed by exposing the substrate to a diamond-like carbon precursor having a structure of formula (I) or a structure of formula (II)

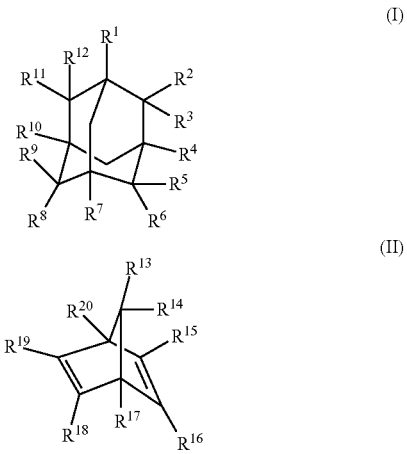

wherein each of $R_1$-$R_{20}$ are independently selected from H, a halogen or a substituted or unsubstituted $C_1$-$C_4$ alkyl. The substrate is then etched through the at least one opening.

In one or more embodiments, an electronic device is described. The electronic device comprises a film on a substrate. The film comprises a diamond-like carbon material having an $sp^3$ content greater than 40 percent.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Figure 1A:
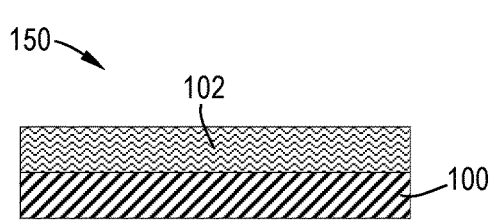
FIG. 1A illustrates a cross-sectional view of a substrate according to the prior art.

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

As used herein, the phrase "amorphous hydrogenated carbon," also referred to as "amorphous carbon" and denoted as a-C:H, refers to a carbon material with no long-range crystalline order which may contain a substantial hydrogen content, for example on the order of about 10 to 45 atomic %. Amorphous carbon is used as a hard mask material in semiconductor applications because of its chemical inertness, optical transparency, and good mechanical properties.

Plasma enhanced chemical vapor deposition (PECVD) is widely used to deposit amorphous carbon films due to cost efficiency and film property versatility. In a PECVD process, a hydrocarbon source, such as a gas-phase hydrocarbon or vapors of a liquid-phase hydrocarbon that have been entrained in a carrier gas, is introduced into a PECVD chamber. A plasma-initiated gas, typically helium, is also introduced into the chamber. Plasma is then initiated in the chamber to create excited CH-radicals. The excited CH-radicals are chemically bound to the surface of a substrate positioned in the chamber, forming the desired amorphous carbon film thereon. Embodiments described herein in reference to a PECVD process can be carried out using any suitable thin film deposition system. Examples of suitable systems include the CENTURA® systems which may use a DXZ® processing chamber, PRECISION 5000® systems, PRODUCER® systems, PRODUCER® GT™ systems, PRODUCER® XP Precision™ systems, PRODUCER® SE™ systems, Sym3® processing chamber, and Mesa™ processing chamber, all of which are commercially available from Applied Materials, Inc., of Santa Clara, Calif. Other tools capable of performing PECVD processes may also be adapted to benefit from the embodiments described herein. In addition, any system enabling the PECVD processes described herein can be used to advantage. Any apparatus description described herein is illustrative and should not be construed or interpreted as limiting the scope of the implementations described herein.

Device manufacturers using an amorphous carbon hard mask layer demand two critical requirements be met: (1) very high selectivity of the hard mask during the dry etching of underlying materials and (2) high optical transparency in the visible spectrum for lithographic registration accuracy. As used herein, the term "dry etching" generally refers to etching processes where a material is not dissolved by immersion in a chemical solution and includes methods such as reactive ion etching, sputter etching, and vapor phase etching.

One of the limitations of currently available amorphous carbon films is the hydrogen content of the film. The high hydrogen content of the films can lead to poor etch selectivity.

Hard masks are used as etch stop layers in semiconductor processing. Ashable hard masks have a chemical composition that allows them to be removed by a technique referred to as ashing once they have served their purpose. An ashable hard mask is generally composed of carbon and hydrogen with trace amounts of one or more dopants (e.g., nitrogen, fluorine, boron, silicon). In a typical application, after etching, the hard mask has served its purpose and is removed from the underlying layer. This is generally accomplished, at least in part, by ashing, also referred to as "plasma ashing" or "dry stripping." Substrates with hard masks to be ashed, generally partially fabricated semiconductor wafers, are placed into a chamber under vacuum, and oxygen is introduced and subjected to radio frequency power, which creates oxygen radicals (plasma). The radicals react with the hard mask to oxidize it to water, carbon monoxide, and carbon dioxide. In some instances, complete removal of the hard mask may be accomplished by following the ashing with additional wet or dry etching processes, for example when the ashable hard mask leaves behind any residue that cannot be removed by ashing alone.

Hard mask layers are often used in narrow and/or deep contact etch applications, where photoresist may not be thick enough to mask the underlying layer. This is especially applicable as the critical dimension shrinks.

Figure 1B:
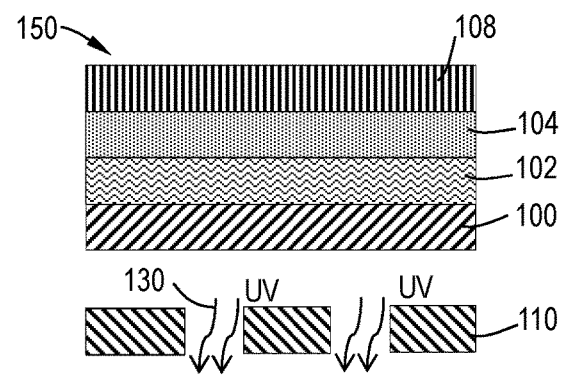
FIG. 1B illustrates a cross-sectional view of a substrate according to the prior art.
Figure 1C:
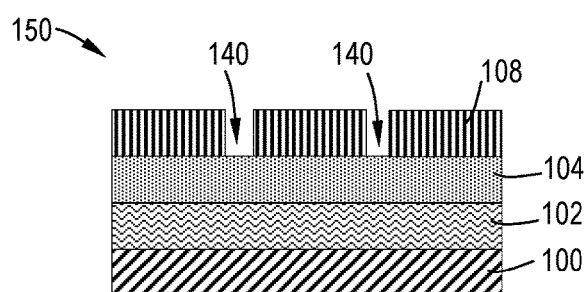
FIG. 1C illustrates a cross-sectional view of a substrate according to the prior art.
Figure 1D:
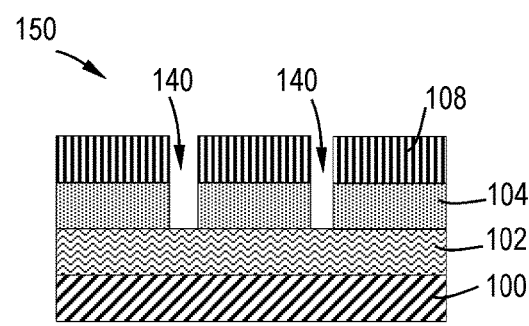
FIG. 1D illustrates a cross-sectional view of a substrate according to the prior art.
Figure 1E:
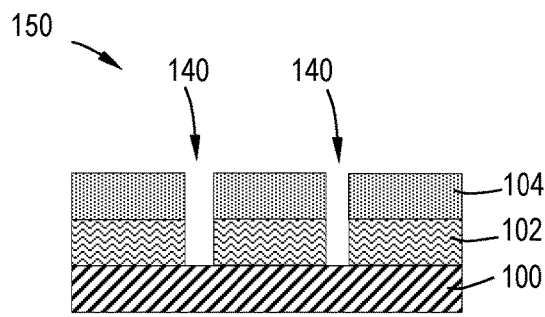
FIG. 1E illustrates a cross-sectional view of a substrate according to the prior art.

FIGS. 1A-1E illustrate schematic cross-sectional views of a substrate 100 at different stages of an integrated circuit fabrication sequence incorporating an amorphous carbon layer as a hard mask, according to the Prior Art. A substrate structure 150 denotes the substrate 100 together with other material layers formed on the substrate 100. FIG. 1A (prior art) illustrates a cross-sectional view of a substrate structure 150 having a material layer 102 that has been conventionally formed thereon. The material layer 102 may be a low-k material and/or an oxide, e.g., $SiO_2$. FIG. 1B (prior art)

depicts an amorphous carbon layer 104 deposited on the substrate structure 150 of FIG. 1A. The amorphous carbon layer 104 is formed on the substrate structure 150 by conventional means, such as via PECVD. The thickness of amorphous carbon layer 104 is variable, depending on the specific stage of processing. Typically, amorphous carbon layer 104 has a thickness in the range of about 500 Å to about 10,000 Å. Depending on the etch chemistry of the energy sensitive resist material 108 used in the fabrication sequence, an optional capping layer (not shown) may be formed on amorphous carbon layer 104 prior to the formation of energy sensitive resist material 108. The optional capping layer functions as a mask for the amorphous carbon layer 104 when the pattern is transferred therein and protects amorphous carbon layer 104 from energy sensitive resist material 108. As depicted in FIG. 1B, energy sensitive resist material 108 is formed on amorphous carbon layer 104. The layer of energy sensitive resist material 108 can be spin-coated on the substrate to a thickness within the range of about 2000 Å to about 6000 Å. Most energy sensitive resist materials are sensitive to ultraviolet (UV) radiation having a wavelength less than about 450 nm, and for some applications having wavelengths of 245 nm or 193 nm. A pattern is introduced into the layer of energy sensitive resist material 108 by exposing energy sensitive resist material 108 to UV radiation 130 through a patterning device, such as a mask 110, and subsequently developing energy sensitive resist material 108 in an appropriate developer. After energy sensitive resist material 108 has been developed, the desired pattern, consisting of apertures/openings 140, is present in energy sensitive resist material 108, as shown in FIG. 1C (prior art). Thereafter, referring to FIG. 1D (prior art), the pattern defined in energy sensitive resist material 108 is transferred through amorphous carbon layer 104 using the energy sensitive resist material 108 as a mask. An appropriate chemical etchant is used that selectively etches amorphous carbon layer 104 over the energy sensitive resist material 108 and the material layer 102, extending apertures 140 to the surface of material layer 102. Appropriate chemical etchants include ozone, oxygen, or ammonia plasmas. Referring to FIG. 1E (prior art), the pattern is then transferred through material layer 102 using the amorphous carbon layer 104 as a hard mask. In this process step, an etchant is used that selectively removes material layer 102 over amorphous carbon layer 104, such as a dry etch, i.e. a non-reactive plasma etch. After the material layer 102 is patterned, the amorphous carbon layer 104 can optionally be stripped from the substrate 100.

Current carbon hard mask films are deposited at very high temperatures and have low hydrogen (H) content, but the films are largely $sp^2$, resulting in lower density and modulus, leading to lower etch selectivity and pattern integrity. Modulus is a measurement of the mechanical strength of the film. Films, particularly thick films, with low modulus have line wiggling and other issues.

In one or more embodiments, a high $sp^3$ amorphous carbon film is advantageously deposited. In one or more embodiment, the deposition is done at low temperatures using diamondoid precursors.

In one or more embodiments, to achieve greater etch selectivity, the density and, more importantly, the Young's modulus of the carbon film is improved. One of the main challenges in achieving greater etch selectivity and improved Young's modulus is the high compressive stress of such a film making it unsuitable for applications owing to the resultant high wafer bow. Hence, there is a need for carbon (diamond-like) films with high-density and modulus (e.g., higher $sp^3$ content, more diamond-like) with high etch selectivity along with low stress (e.g., <−500 MPa).

As used herein, the terms "diamond-like" and/or "diamonoid" refer to a class of chemical compounds having a diamond crystal lattice. Diamondoids may include one or more carbon cages (e.g. adamantine, diamantine, triamantane, and high polymantanes). Diamondoids of the adamantine series are hydrocarbons composed of fused cyclohexane rings which form interlocking cage structures. Diamondoids may be substituted and unsubstituted caged compounds. These chemical compounds may occur naturally, or can be synthesized. Diamondoids have a high $sp^3$ content and also have a high C:H ratio. In the general sense, diamond-like carbon materials are strong, stiff structures having dense 3D networks of covalent bonds.

Embodiments described herein, include improved methods of fabricating carbon hard mask films with high-density (e.g., >1.8 g/cc), high Young's elastic modulus (e.g., >150 GPa), and low stress (e.g., <−500 MPa). In one or more embodiments, the Young's modulus is measured at room temperature, or at ambient temperature, or at a temperature in the range of from about 22° C. to about 25° C. In one or more embodiment, Young's modulus of the diamond-like carbon may be greater than 150 GPa, including greater than 160 GPa, greater than 170 GPa, greater than 180 GPa, greater than 190 GPa, greater than 200 GPa, greater than 210 GPa, greater than 220 GPa, greater than 230 GPa, greater than 240 GPa, and greater than 250 GPa. In one or more embodiment, Young's modulus of the diamond-like carbon may be greater than 200 GPa. The carbon films fabricated according to the embodiments described herein are amorphous in nature and have a higher etch selectivity with much greater modulus (e.g., >150 GPa) along with lower stress (<−500 MPa) than current patterning films. In one or more embodiment, the stress is less than −500 MPa. In one or more embodiment, the stress is about −250 MPa. In one or more embodiment, the stress is in a range of about −250 MPa to less than about −500 MPa. In one or more embodiment, the stress is less than about −250 MPa.

In one or more embodiment, the diamond-like carbon film has a Young's Modulus, measured at room temperature, of greater than 250 GPa and a stress of about −250 MPa.

In one or more embodiment, the diamond-like carbon film has a Young's Modulus, measured at room temperature, of greater than 250 GPa and a stress of about −250 MPa.

In one or more embodiment, the density of the diamond-like carbon is greater than 1.8 g/cc, including greater than 1.9 g/cc, and including greater than 2.0 g/cc. In one or more embodiment, the density of the diamond-like carbon is about 2.1 g/cc. In one or more embodiment, the density of the diamond-like carbon is in a range of about greater than 1.8 g/cc to about 2.2 g/cc. In one or more embodiment, the density of the diamond-like carbon is greater than about 2.2 g/cc.

The diamond-like carbon films fabricated according to the embodiments described herein not only have a low stress but also have a high $sp^3$ carbon content.

In one or more embodiments, a method comprising a film on a substrate is described. In one or more embodiment, the method comprised forming a film on a substrate by exposing the substrate to a diamond-like carbon precursor having an $sp^3$ content greater than 40 percent.

Figure 2A:
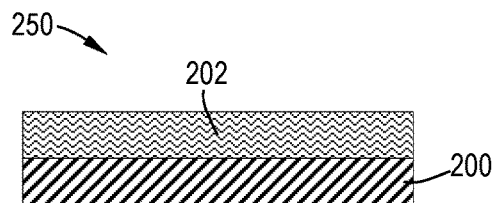
FIG. 2A illustrates a cross-sectional view of a substrate according to one or more embodiment.
Figure 2B:
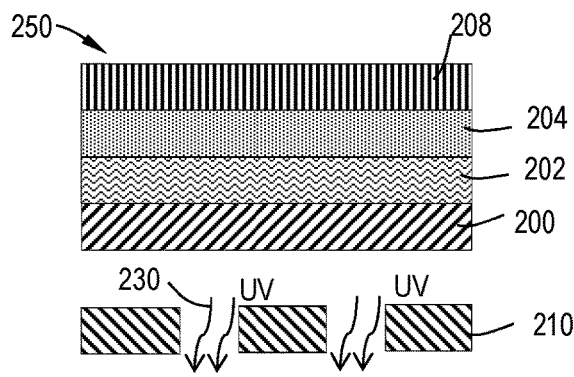
FIG. 2B illustrates a cross-sectional view of a substrate according to one or more embodiment.

An advantage of the diamond-like carbon film of one or more embodiments is the enhancement of etch selectivity when compared to other amorphous carbon films. FIGS. 2A-2E illustrate schematic cross-sectional views of a substrate 200 at different stages of an integrated circuit fabrication sequence incorporating diamond-like carbon layer as a hard mask. A substrate structure 250 denotes the substrate 200 together with other material layers formed on the substrate 200. FIG. 2A illustrates a cross-sectional view of a substrate 200 having a material layer 202 that has been conventionally formed thereon. In one or more embodiments, substrate 200 has at least one feature selected from a peak, a trench, or a via. The material layer 202 may be a low-k material and/or an oxide, e.g., $SiO_2$. FIG. 2B depicts diamond-like carbon film 204 deposited on the material layer 202. The diamond-like carbon film 204 is formed on the substrate structure 250 by conventional means. In one or more embodiment, the diamond-like carbon layer 205 is formed on substrate 200 by pulsed plasma enhanced chemical vapor deposition (PECVD). The thickness of diamond-like carbon film 204 is variable, depending on the specific stage of processing. Typically, diamond-like carbon film 204 has a thickness in the range of about 300 Å to greater than or equal (≥) to about 20,000 Å, depending upon whether the application is for logic or for memory. Because of the etch chemistry of the diamond-like carbon film 204 used in the fabrication sequence, a capping layer does not need to be formed on diamond-like carbon film 204 prior to the formation of energy sensitive resist material 208. As discussed above, a capping layer functions as a mask for an amorphous carbon layer when the pattern is transferred therein and protects amorphous carbon layer from energy sensitive resist materials. Without intending to be bound by theory, it is believed that the higher density and modulus of the diamond-like carbon film 204 are a result of the high content of $sp^3$ hybridized carbon atoms in the film, which result in a hard mask layer that is highly etch selective, eliminating the need for a capping layer.

In an embodiment, the substrate 200 comprises a semiconductor material, e.g., silicon (Si), carbon (C), germanium (Ge), silicon germanium (SiGe), gallium arsenide (GaAs), indium phosphide (InP), indium gallium arsenide (InGaAs), aluminum indium arsenide (InAlAs), other semiconductor material, or any combination thereof. In an embodiment, substrate 200 is a semiconductor-on-isolator (SOI) substrate including a bulk lower substrate, a middle insulation layer, and a top monocrystalline layer. The top monocrystalline layer may comprise any material listed above, e.g., silicon. In various embodiments, the substrate 200 can be, e.g., an organic, a ceramic, a glass, or a semiconductor substrate. Although a few examples of materials from which the substrate 200 may be formed are described here, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In one embodiment, substrate 200 includes one or more metallization interconnect layers for integrated circuits. In at least some embodiments, the substrate 300 includes interconnects, for example, vias, configured to connect the metallization layers. In at least some embodiments, the substrate 200 includes electronic devices, e.g., transistors, memories, capacitors, resistors, optoelectronic devices, switches, and any other active and passive electronic devices that are separated by an electrically insulating layer, for example, an interlayer dielectric, a trench insulation layer, or any other insulating layer known to one of ordinary skill in the art of the electronic device manufacturing. In one embodiment, the substrate 200 includes one or more layers above substrate 200 to confine lattice dislocations and defects.

The diamond-like carbon film 204 may be formed on the substrate 200 by any technique known to those of skill in the art including, but not limited to, chemical vapor deposition (CVD), thermal chemical vapor deposition (CVD), plasma enhanced chemical vapor deposition (PECVD), etc. The thickness of diamond-like carbon film 204 is variable. In one or more embodiments, the diamond-like carbon film 204 may have a thickness in a range of about 10 nm to about 30 nm. A thickness in the range of about 10 nm to about 30 nm makes the diamond-like carbon film 204 particularly suited for logic applications. In one or more embodiments, the thickness of the diamond-like carbon film 204 is in the micron range, making it particularly suited for memory (DRAWM/NANA) applications.

Figure 2C:
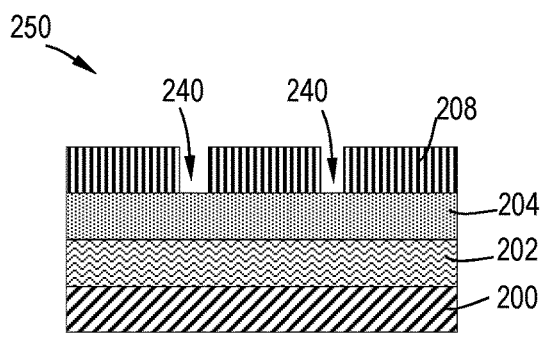
FIG. 2C illustrates a cross-sectional view of a substrate according to one or more embodiment.
Figure 2D:
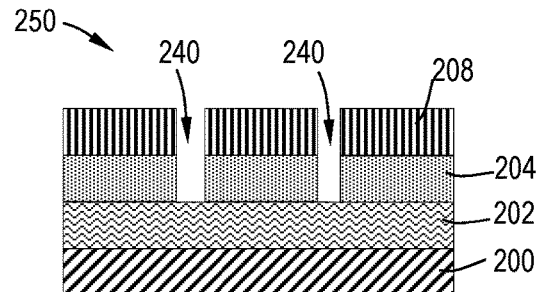
FIG. 2D illustrates a cross-sectional view of a substrate according to one or more embodiment.
Figure 2E:
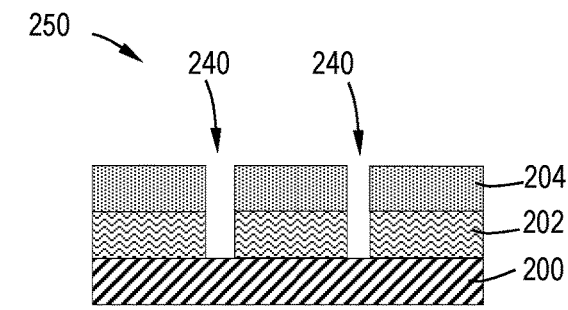
FIG. 2E illustrates a cross-sectional view of a substrate according to one or more embodiment.

As depicted in FIG. 2B, energy sensitive resist material 208 is formed on diamond-like carbon film 204. The layer of energy sensitive resist material 208 can be spin-coated on the substrate to a thickness within the range of about 2000 Å to about 6000 Å. Most energy sensitive resist materials are sensitive to ultraviolet (UV) radiation having a wavelength less than about 450 nm, and for some applications having wavelengths of 245 nm or 193 nm. A pattern is introduced into the layer of energy sensitive resist material 208 by exposing energy sensitive resist material 208 to UV radiation 230 through a patterning device, such as a mask 210, and subsequently developing energy sensitive resist material 208 in an appropriate developer. After energy sensitive resist material 208 has been developed, the desired pattern, consisting of apertures/openings 240, is present in energy sensitive resist material 208, as shown in FIG. 2C. Thereafter, referring to FIG. 2D, the pattern defined in energy sensitive resist material 208 is transferred through diamond-like carbon film 204 using the energy sensitive resist material 208 as a mask. An appropriate chemical etchant is used that selectively etches diamond-like carbon film 204 over the energy sensitive resist material 208 and the material layer 202, extending apertures 240 to the surface of material layer 202. In one or more embodiments wherein the diamond-like carbon film 204 is etch selective and strip selective over spin-on-carbon (SOC). Appropriate chemical etchants include ozone, oxygen, or ammonia plasmas. Referring to FIG. 2E, the pattern is then transferred through material layer 202 using the diamond-like carbon film 204 as a hard mask. In this process step, an etchant is used that selectively removes material layer 202 over diamond-like carbon film 204, such as a dry etch, i.e. a non-reactive plasma etch. After the material layer 202 is patterned, the diamond-like carbon film 204 can optionally be stripped from the substrate 200.

In some embodiments, the diamond-like carbon films described herein may be formed by chemical vapor deposition (plasma enhanced and/or thermal) processes using hydrocarbon-containing gas mixtures including precursors having a formula (I) or a formula (II)

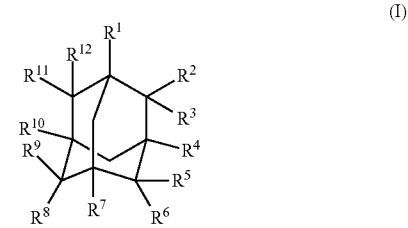

(I)

-continued

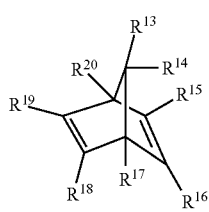

(II)

wherein each of $R_1$-$R_{20}$ are independently selected from H, a halogen or a substituted or unsubstituted $C_1$-$C_4$ alkyl.

As used herein, "halogen" refers to one or more of a group of element in the periodic table, more particularly fluorine (F), chlorine (Cl), bromine (Br), iodine (I), and astatine (At).

As used herein, "alkyl," or "alk" includes both straight and branched chain hydrocarbons, containing 1 to 20 carbons, in the normal chain, such as methyl, ethyl, propyl, isopropyl, butyl, t-butyl, isobutyl, pentyl, hexyl, isohexyl, heptyl, 4,4-dimethylpentyl, octyl, 2,2,4-trimethyl-pentyl, nonyl, decyl, undecyl, dodecyl, the various branched chain isomers thereof, and the like. Such groups may optionally include up to 1 to 4 substituents. In one or more embodiments, each of $R_1$-$R_{10}$ are independently from H, a halogen, or a substituted or unsubstituted $C_1$-$C_4$ alkyl.

In one or more embodiment, the diamond-like precursor comprises one or more of adamantane, bromo-adamantane, chloro-adamantane, fluoro-adamantane, iodo-adamantane, di-bromoadamantane, di-chloroadamantane, di-fluoroadamantane, di-iodoadamante, iceane, diamantane, triamantane, isotetramantane, pentamantane, cyclohexamantange, divinyladamantane, 1,2-dimethyladamantane, 1,3-dimethyladamantane, bicyclo[2.2.1]hepta-2,5-diene (2,5-norbornadiene), adamantine ($C_{10}H_{16}$), or norbornene ($C_7H_{10}$).

The deposition process may be carried out at temperatures ranging from −50 degrees Celsius to 600 degrees Celsius. The deposition process may be carried out at pressures ranging from 0.1 mTorr to 10 Torr in a processing volume. The hydrocarbon-containing gas mixture may further include any one of, or a combination of any of He, Ar, Xe, $N_2$, $H_2$. The hydrocarbon-containing gas mixture may further include etchant gases such as $Cl_2$, $CF_4$, $NF_3$ to improve film quality. The plasma (e.g., capacitive-coupled plasma) may be formed from either top and bottom electrodes or side electrodes. The electrodes may be formed from a single powered electrode, dual powered electrodes, or more electrodes with multiple frequencies such as, but not limited to, 350 KHz, 2 MHz, 13.56 MHz, 27 MHz, 40 MHz, 60 MHz and 100 MHz, being used alternatively or simultaneously in a CVD system with any or all of the reactant gases listed herein to deposit a thin film of diamond-like carbon for use as a mandrel. The high etch selectivity of the diamond-like carbon film is achieved by having higher density and modulus than current generation films. Not to be bound by theory but it is believed that the higher density and modulus are a result of the high content of $sp^3$ hybridized carbon atoms in the film, which in turn may be achieved by a combination of low pressure and plasma power.

In some embodiments, hydrogen radical are fed through an RPS, which leads to selective etching of $sp^2$ hybridized carbon atoms thereby increasing the $sp^3$ hybridized carbon atom fraction of the film further, thus further increasing the etch selectivity.

The quantity/percentage of $sp^3$ hybridized carbon atoms in the as deposited diamond-like carbon may vary from application to application. In various embodiments of the present disclosure, the as-deposited diamond-like carbon film may contain at least 40, 45, 50, 55, 60, 65, 70, 75, 80, or 85 percent of $sp^3$ hybridized carbon atoms. The as-deposited diamond-like carbon film may contain up to 45, 50, 55, 60, 65, 70, 75, 80, 85, or 90 percent of $sp^3$ hybridized carbon atoms. The as-deposited diamond-like carbon film may contain from about 50 to about 90 percent of $sp^3$ hybridized carbon atoms. The as-deposited diamond-like carbon film may contain from about 60 to about 70 percent of $sp^3$ hybridized carbon atoms.

In one or more embodiments, the high-density diamond-like carbon film with high $sp^3$ content, which is used as a hard mask, shows good etch selectivity versus oxide/nitride and also excellent strip selectivity versus existing hard masks and spin-on-carbon (SOC).

In one or more embodiment, the diamond-like carbon precursors may be combined with one or more additional precursor selected from $C_2H_2$, $C_3H_6$, $CH_4$, or $C_4H_8$.

Another advantage of the method of one or more embodiments is that a lower temperature process may be used to produce a diamond-like carbon with the desired density and transparency. Ordinarily, higher substrate temperature during deposition is the process parameter used to encourage the formation of a higher density film. When the diamond-like carbon precursors of one or more embodiments are used, substrate temperature may be reduced during deposition, for example to as low as about less than 0° C. and less than about 10° C., about room temperature, or about 22° C. to about 26° C., and still produce a film of the desired density, i.e., greater than about 1.8 g/cc, including greater than about 1.9 g/cc, and including greater than about 2.0 g/cc. Hence, the method of one or more embodiment may produce a relatively high density film with an absorption coefficient as low as about 0.04. Further, lower processing temperatures are generally desirable for all substrates, since this lowers the thermal budget of the process, protecting devices formed thereon from dopant migration. Additionally, lower processing temperatures are generally desirable for emerging memory applications.

In one or more embodiments, the diamond-like carbon film is deposited with the use of a plasma. In other embodiment, the diamond-like carbon film is deposited without the use, in the absence of, a plasma.

In one or more embodiment, the diamond-like carbon precursor is heated in an ampoule and is flowed to the substrate with a carrier gas. As used herein, the term "carrier gas" refers to a fluid (either gas or liquid) that can move a precursor molecule from one location to another. For example, a carrier gas can be a liquid that moves molecules from a solid precursor in an ampoule to an aerosolizer. In some embodiments, a carrier gas is an inert gas. In one or more embodiment, a carrier gas is one or more of hydrogen ($H_2$), argon (Ar), helium (He), xenon (Xe), nitrogen ($N_2$), or krypton (Kr).

In one or more embodiment, the diamond-like carbon film is a hard mask layer.

In one or more embodiment, the substrate has a layer to be patterned.

In one or more embodiment, the substrate comprises one or more of an adhesion layer or a dielectric layer.

One or more embodiments provide a method of etching a substrate. As used herein, the term "etching" refers to a process to chemical remove layers from the surface of a substrate, e.g. wafer, during semiconductor manufacturing. Etching is a critically important process during semiconductor manufacturing, and every substrate undergoes many etching steps before it is complete. In one or more embodiment, the substrate is protected from the etchant by a masking material, which resists etching. In one or more embodiments, the hard mask material is a photoresist, which has been patterned using photolithography.

In one or more embodiments, the diamond-like carbon is a hard mask, which has been patterned using photolithography or other methods known to those of skill in the art. In one or more embodiments, the diamond-like carbon may make patterning more difficult due to the density of the film.

Figure 3A:
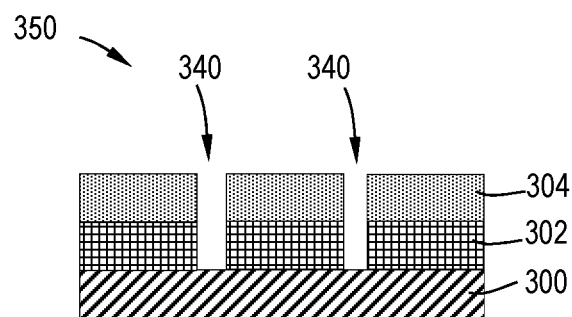
FIG. 3A illustrates a cross-sectional view of a substrate according to one or more embodiment.

One or more embodiments provide a method of etching a substrate. Referring to FIG. 3A, in one or more embodiment, a diamond-like carbon hard mask 304 is formed on a substrate 300. In one or more embodiment, the diamond-like carbon hard mask has at least one opening 340 and is formed by exposing the substrate to a diamond-like carbon precursor having a structure of formula (I) or a structure of formula (II)

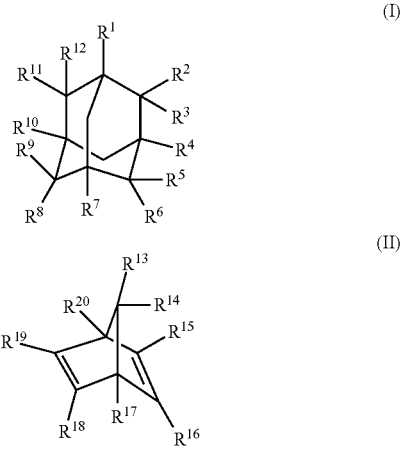

wherein each of $R_1$-$R_{20}$ are independently selected from H, a halogen, or a substituted or unsubstituted $C_1$-$C_4$ alkyl. In one or more embodiment, the substrate 300 is etched through the at least one opening 340.

In one or more embodiment, the diamond-like carbon hard mask is formed at a temperature less than about 100° C. and a pressure in the range of about 1 mTorr to about 100 Torr. In one or more embodiments, the diamond-like carbon hard mask 304 has been patterned using photolithography or other methods known to those of skill in the art.

Figure 3B:
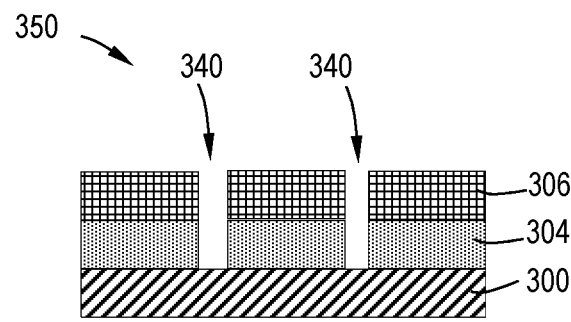
FIG. 3B illustrates a cross-sectional view of a substrate according to one or more embodiment.

In one or more embodiments, a photoresist 302 is formed on the substrate 300 prior to etching. In one or more embodiments, the photoresist 302 is formed between the substrate 300 and the diamond-like carbon hard mask 304. Referring to FIG. 3B, in one or more embodiment, the photoresist 306 is formed on the diamond-like carbon hard mask 304.

Figure 3C:
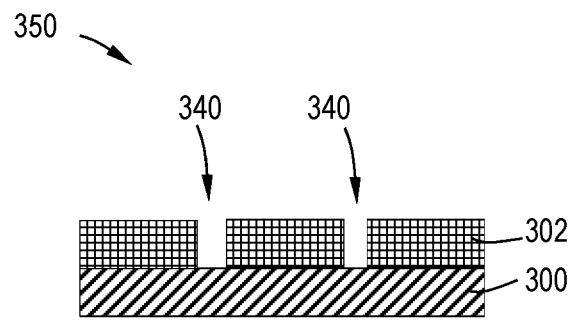
FIG. 3C illustrates a cross-sectional view of a substrate according to one or more embodiment.

Referring to FIG. 3C, after the substrate 300 is etched, in one or more embodiments, the diamond-like carbon hard mask 304 is removed. In one or more embodiment, the diamond-like carbon hard mask 304 is removed by ashing.

In the foregoing specification, embodiments of the disclosure have been described with reference to specific exemplary embodiments thereof. It will be evident that various modifications may be made thereto without departing from the broader spirit and scope of the embodiments of the disclosure as set forth in the following claims. The specification and drawings are, accordingly, to be regarded in an illustrative sense rather than a restrictive sense.

What is claimed is:

1. A method comprising forming a film on a substrate by exposing the substrate to a diamond-like carbon precursor having a structure of formula (II)

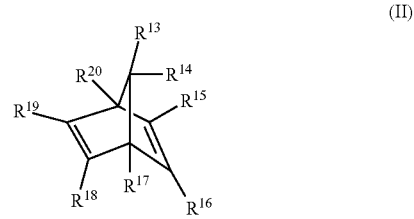

wherein each of $R_{13}$-$R_{20}$ are independently selected from H, a halogen, or a substituted or unsubstituted $C_1$-$C_4$ alkyl, and wherein the film has a Young's modulus greater than 180 GPa, measured at room temperature.

2. The method of claim 1, wherein the diamond-like carbon precursor comprises one or more bicyclo[2.2.1]hepta-2,5-diene (2,5-norbornadiene) or norbornene ($C_7H_{10}$).

3. The method of claim 1, wherein the film is etch selective and strip selective over spin-on-carbon (SOC).

4. The method of claim 1, wherein the film is a hard mask layer.

5. The method of claim 1, wherein the substrate comprises at least one feature selected from a peak, a trench, or a via.

6. The method of claim 1, further comprising mixing the diamond-like carbon precursor with one or more additional precursor selected from $C_2H_2$, $C_3H_6$, $CH_4$, or $C_4H_8$.

7. The method of claim 1, wherein the diamond-like carbon precursor is heated in an ampoule and flowed to the substrate with a carrier gas.

8. The method of claim 7, wherein the carrier gas comprises one or more of hydrogen ($H_2$), argon (Ar), helium (He), xenon (Xe), or nitrogen ($N_2$).

9. A method of etching a substrate comprising:
    forming a carbon hard mask on the substrate, the carbon hard mask having at least one opening and formed by exposing the substrate to a diamond-like carbon precursor having a structure of formula (II)

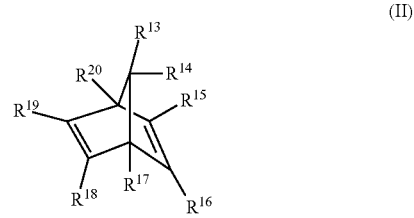

wherein each of $R_{13}$-$R_{20}$ are independently selected from H, a halogen or a substituted or unsubstituted $C_1$-$C_4$ alkyl, and wherein the carbon hard mask has a Young's modulus greater than 180 GPa, measured at room temperature; and
    etching the substrate through the at least one opening.

10. The method of claim 9, wherein the diamond-like carbon precursor comprises one or more the diamond-like precursor comprises one or more of bicyclo[2.2.1]hepta-2,5-diene (2,5-norbornadiene) or norbornene ($C_7H_{10}$).

11. The method of claim 9, further comprising forming a photoresist prior to etching, the photoresist formed between the substrate and the hard mask or on the hard mask.

12. The method of claim 9, further comprising mixing the diamond-like carbon precursor with one or more additional precursor selected from $C_2H_2$, $C_3H_6$, $CH_4$, or $C_4H_8$.

13. The method of claim 9, further comprising removing the carbon hard mask after etching the substrate.

* * * * *